United States Patent [19]

Givens et al.

[11] Patent Number: 5,268,330
[45] Date of Patent: Dec. 7, 1993

[54] PROCESS FOR IMPROVING SHEET RESISTANCE OF AN INTGEGRATED CIRCUIT DEVICE GATE

[75] Inventors: John H. Givens; James S. Nakos, both of Essex; Peter A. Burke, Milton; Craig M. Hill, Essex Junction; Chung H. Lam, Williston, all of Vt.

[73] Assignee: International Business Machines Corporation, Armonk, N.Y.

[21] Appl. No.: 989,604

[22] Filed: Dec. 11, 1992

[51] Int. Cl.$^5$ .................. H01L 21/283; H01L 21/302
[52] U.S. Cl. ........................ 437/195; 437/41; 437/200; 437/228; 156/653
[58] Field of Search ................ 437/41, 195, 200, 228; 156/653, 644, 645

[56] References Cited

U.S. PATENT DOCUMENTS

| | | | |
|---|---|---|---|
| 4,518,629 | 5/1985 | Jeuch | 437/195 |
| 4,587,718 | 5/1986 | Haken et al. | 29/571 |
| 4,690,730 | 9/1987 | Tang et al. | 156/643 |
| 4,740,484 | 4/1988 | Norström et al. | 437/200 |
| 4,746,219 | 5/1988 | Holloway et al. | 357/23.11 |
| 4,753,709 | 6/1988 | Welch et al. | 156/643 |
| 4,755,478 | 7/1988 | Abernathey et al. | 437/41 |
| 4,795,722 | 1/1989 | Welch et al. | 437/192 |
| 4,824,521 | 4/1989 | Kulkarni et al. | 156/643 |
| 4,849,369 | 7/1989 | Jeuch et al. | 437/43 |
| 4,877,775 | 10/1989 | Rodder | 437/200 |
| 4,966,870 | 10/1990 | Barber et al. | 437/228 |
| 4,994,402 | 2/1991 | Chiu | 437/41 |
| 5,013,678 | 5/1991 | Winnerl et al. | 437/52 |
| 5,022,958 | 6/1991 | Favreau et al. | 156/643 |
| 5,034,348 | 7/1991 | Hartswick et al. | 437/200 |
| 5,081,065 | 1/1992 | Jonkers et al. | 437/200 |
| 5,086,017 | 4/1992 | Lu | 437/200 |

FOREIGN PATENT DOCUMENTS 2-283034 11/1990 Japan.

OTHER PUBLICATIONS

Reith, T. M. & Sullivan, M. J., "Controlled Ohmic Contact and Planarization For Very Shallow Junction Structures", IBM Technical Disclosure Bulletin, vol. 20, No. 9, Feb. 1978, pp. 3480-3483.

Lasky, J. B. et al., "Composition of Transformation to Low-Resistivity Phase and Agglomeration of $TiSi_2$ and $CoSi_2$", IEEE Transactions on Electron Devices, vol. 38, No. 2, Feb. 1991, pp. 262-269.

*Primary Examiner*—T. N. Quach
*Attorney, Agent, or Firm*—Heslin & Rothenberg

[57] ABSTRACT

A passivating layer is deposited over an integrated circuit device, conventionally fabricated using silicidation, after which an insulating layer is deposited. The insulating layer is planarized and further polished to expose the passivating layer above the gate. The portion of the passivating layer above the gate is removed with little or no effect on the insulating layer or gate. A trench above one or both junctions (source or drain) is formed by removing insulation using the passivating layer as an etch stop, then removing a portion of the passivating layer above the junction with little or no effect on the junction or any isolation region present. The gate may be further silicided, and the opening above the gate and the trench above the junction may each be planarly filled with a low sheet resistance conductive material, forming contacts. The contact above the junction may be borderless.

37 Claims, 3 Drawing Sheets

PROCESS FOR IMPROVING SHEET RESISTANCE OF AN INTGEGRATED CIRCUIT DEVICE GATE

BACKGROUND OF THE INVENTION

2. Technical Field

The present invention relates generally to fabrication of integrated circuit devices. More particularly, the present invention relates to a process for improving sheet resistance of an integrated circuit device gate during fabrication.

BACKGROUND ART

As VLSI and ULSI technologies continue to require improvements in the performance of integrated circuit devices, processes must be developed to meet those requirements which easily integrate into existing fabrication processes. In particular, increases in speed require low sheet resistance gates to minimize time constants, as well as narrower gate widths, thinner gate dielectrics and shallower source and drain regions. Today, there are two main prior art approaches attempting to meet these requirements, both of which suffer from limitations.

One approach is exemplified by U.S. Pat. No. 5,034,348, entitled "Process For Forming Refractory Metal Silicide Layers of Different Thicknesses In An Integrated Circuit", by Hartswick et al., and assigned to IBM. There, a process is disclosed which allows for different refractory metal silicides in the gate versus source/drain regions, as well as providing for thicker silicide in the gate region compared to the source/drain regions. Hartswick et al. use titanium silicide ($TiSi_2$) for the gate. The process of Hartswick et al. may not be optimum at high temperatures associated with VLSI and ULSI processing, as $TiSi_2$ tends to agglomerate at high temperatures. Agglomeration refers to formation of non-uniformities in the $TiSi_2$, such as peaks, pits, or areas where $TiSi_2$ has receded. In addition, the aforementioned process may not integrate efficiently into subsequent processing steps. A special non-reflective film (titanium nitride) is required to insure proper photolithography, and a special etching process is required to control polycrystalline silicon gate dimensions, since the presence of titanium may cause etching difficulties.

Another example of a silicidation approach is U.S. Pat. No. 4,755,478, entitled "Method of Forming Metal-Strapped Polysilicon Gate Electrode for FET Device," issued to Abernathy et al., and assigned to IBM. There, the top of the an integrated circuit device gate is isolated from the source and drain for silicidation. Also disclosed is the use of a silicon nitride cap on the gate as a polish stop. The nitride cap places an extra burden on gate tolerances, as it must first be defined and then used to define the polysilicon region of the gate stack. Two additional photomasking steps are also required to implant the polysilicon gate. The additional photomasking steps increase both cost and processing time. In addition, compatibility with next level processing is not made a priority.

A second approach involves metal silicide deposition using chemical vapor deposition (CVD). This second approach suffers from an incorporation of impurities into the gate. For example, if tungsten hexafluoride ($WF_6$) is used, the CVD process results in fluorine incorporation into the gate. The amount of fluorine incorporated directly affects gate oxide thickness, which determines how well the gate couples with the source and drain. In addition, if tungsten silicide is used, its resistivity as a silicide is much larger than that of $TiSi_2$. The result is a thicker gate stack to achieve a given sheet resistance, which may be unacceptable in subsequent processing steps. Finally, since CVD is typically not stoichiometric (a two-to-one silicone-to-metal ratio), this second approach requires an anneal to drive off excess silicone, which may be at too high a temperature for some applications.

Thus, a need exists for a process to improve integrated circuit device gate sheet resistance without increasing the amount of silicide formed in the source and drain. A need also exists for a process to accomplish the above which integrates with existing fabrication processes.

DISCLOSURE OF THE INVENTION

The present invention provides a process for achieving improved sheet resistance of an integrated circuit device gate with shallow source and drain regions, utilizing the silicidation approach, by introducing a passivating layer used as both a polish stop and an etch stop. After a gate stack and at least partially silicided source and drain regions (generally referred to as "junctions") have been formed on a substrate, with a spacer adjacent to the gate stack and overlapping each junction, and a thin dielectric layer between the gate stack and substrate, a passivating layer is deposited. On top of the passivating layer, an insulating layer is deposited and planarized. Polishing at planarity continues until the passivating layer above the gate is exposed. The gate top is then exposed by removing the passivating layer above the gate selective to the insulating layer and gate stack. The term "selective to" refers to the passivating layer above the gate being removed with little or no removal of the insulating layer and gate stack. A trench or hole, hereinafter referred to as a trench, is created above one or both junctions by etching the insulation layer, using the passivating layer as an etch stop. The trench is extended through the passivating layer selective to the junction. The area above the gate as well as the extended trench can then each be filled with a low sheet resistance conductive material, creating low resistance contacts to the gate and junction. In a second embodiment, the contact to the junction is borderless. That is, it partially contacts the junction and an isolation region in the substrate next to the junction.

These, and other objects, features and advantages of this invention will become apparent from the following detailed description of the presently preferred embodiments of the invention taken in conjunction with the accompanying drawings.

BEST MODE FOR CARRYING OUT THE INVENTION

Figure 1:
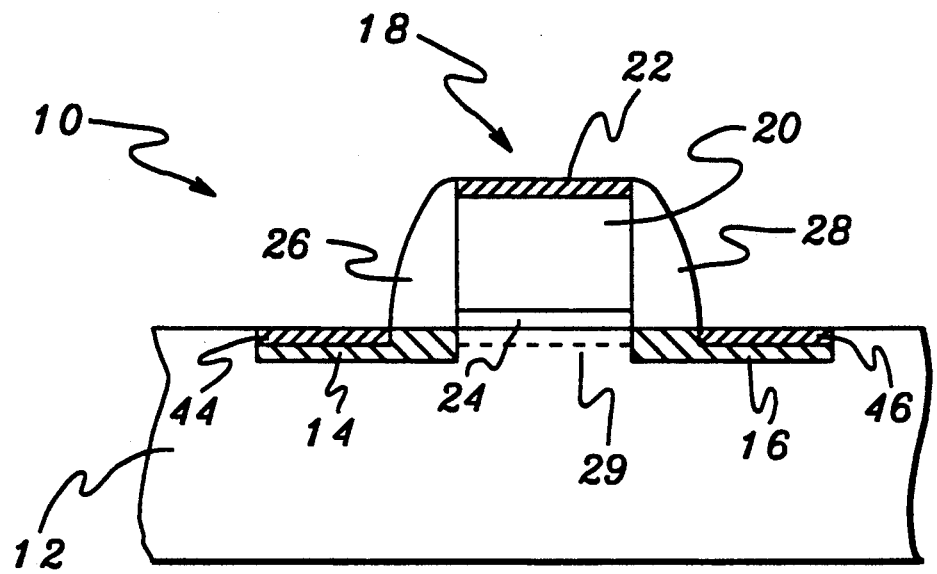
FIG. 1 presents a cross-sectional view of an integrated circuit device fabricated according to conventional processes.

FIG. 1 depicts an integrated circuit device 10 conventionally fabricated. Silicon substrate 12 has junctions 14 and 16 implanted therein. Each junction may be a source or a drain. Junctions 14 and 16 are activated; that is, they have been doped with n-type or p-type dopants and annealed. The junctions are then silicided. That is, the regions of substrate 12 where junctions 14 and 16 are exposed, regions 44 and 46, are reacted with a refractory metal, such as titanium or cobalt, forming an intermetallic compound with the silicon known as silicide. It will be understood that the junctions need not have been activated prior to silicidation, except that the present embodiment utilizes Ti as the silicide material. Activation requires high heat cycles, which $TiSi_2$ cannot tolerate. Thus, activation must precede silicidation when Ti is used.

A gate stack 18 is formed on substrate 12 between junctions 14 and 16. Gate stack 18 is, for example, made of doped polycrystalline silicon (polysilicon). Gate stack 18 may be n+ doped or p+ doped. It will be understood that gate stack 18 may be dual doped by implanting different n+ and p+ regions. Included in gate stack 18 may be an at least partially silicided portion 22 and an unsilicided portion 20. A thin dielectric layer 24, on the order of 100 angstroms or less, separates gate stack 18 from substrate 12 and may comprise, for example, silicon dioxide. In a previous fabrication step (not shown), the width of diffusion region 29 in relation to junctions 14 and 16 was controlled by the width of spacers 26 and 28. Prior to silicidation, creating silicided regions 44 and 46, the area of substrate 12 including the junctions and diffusion region 29 was one large diffusion region. After creation of gate stack 18 and the spacers were placed, ion implantation and activation anneals created junctions 14 and 16, while the spacers and gate stack insulated diffusion region 29 from the silicide material. The spacers could comprise, for example, silicon nitride. As is known in the art, the purpose of diffusion region 29 is to control the threshold voltages of the integrated circuit device 10.

Figure 2:
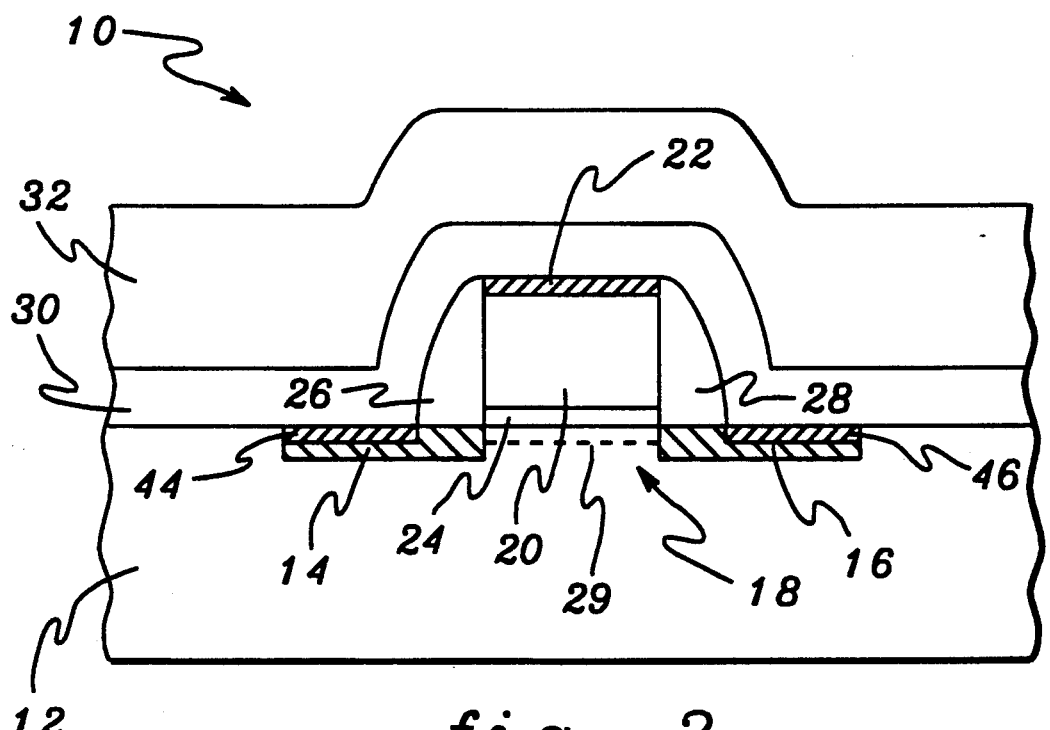
FIG. 2 depicts the integrated circuit device of FIG. 1 with a passivating layer deposited on the integrated circuit device and an insulating layer deposited on the passivating layer, according to the present invention.

The present invention begins at this point in the fabrication process. First, a passivating layer 30 is applied over the integrated circuit structure and then an insulating layer 32 is applied over passivating layer 30. Preferably, passivating layer 30 is conformally applied. FIG. 2 shows the integrated circuit device 10 of FIG. 1 after passivating layer 30 and insulating layer 32 have been deposited. The insulating and passivating layers may be deposited, for example, by conventional chemical vapor deposition processes that are well-known in the art. The thin passivating layer, nominally about 1000 angstroms thick, may comprise silicon nitride and provides protection against ionics (e.g., sodium). The passivating layer serves as a polish stop, since it is chosen to polish significantly slower than the insulating layer, and also serves as an etch stop, since the etch chemistries for the two layers are different. The insulating layer separates the integrated circuit device 10 from subsequent metal layers and could be, for example, phosphosilicate glass (PSG) on the order of 3500 angstroms thick, or gate stack height (here, 2000 angstroms) plus 1500 angstroms.

Figure 3:
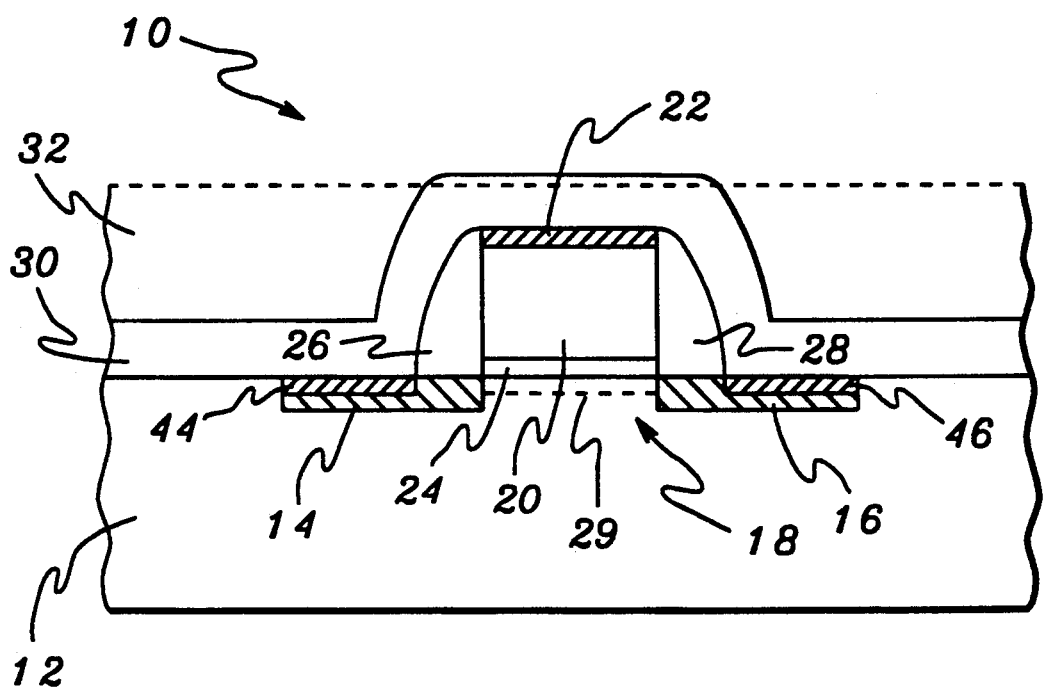
FIG. 3 depicts the integrated circuit device of FIG. 2 after planarization of the insulating layer and planar polishing beyond planarization to the passivating layer.

Planarization of insulating layer 32 then takes place. Planarization can be accomplished, for example, by utilizing a planarization blocking mask (e.g., photoresist) with reactive ion etching. Reactive ion etching is well-known in the art and accordingly need not be further described herein. FIG. 3 depicts the integrated circuit device of FIG. 2 after planarization of insulating layer 32. Planarization of insulating layer 32 is then done to expose passivating layer 30 above gate stack 18, as shown by dashed line 34. As an example, chemical-mechanical polishing (CMP) could be used to planarize insulating layer 32. CMP is wellknown in the art. That the passivating layer works well as a polish stop is exemplified by using the example insulating and passivating layer compositions. The polish rate of PSG compared to silicon nitride is about four-to-one.

Figure 4:
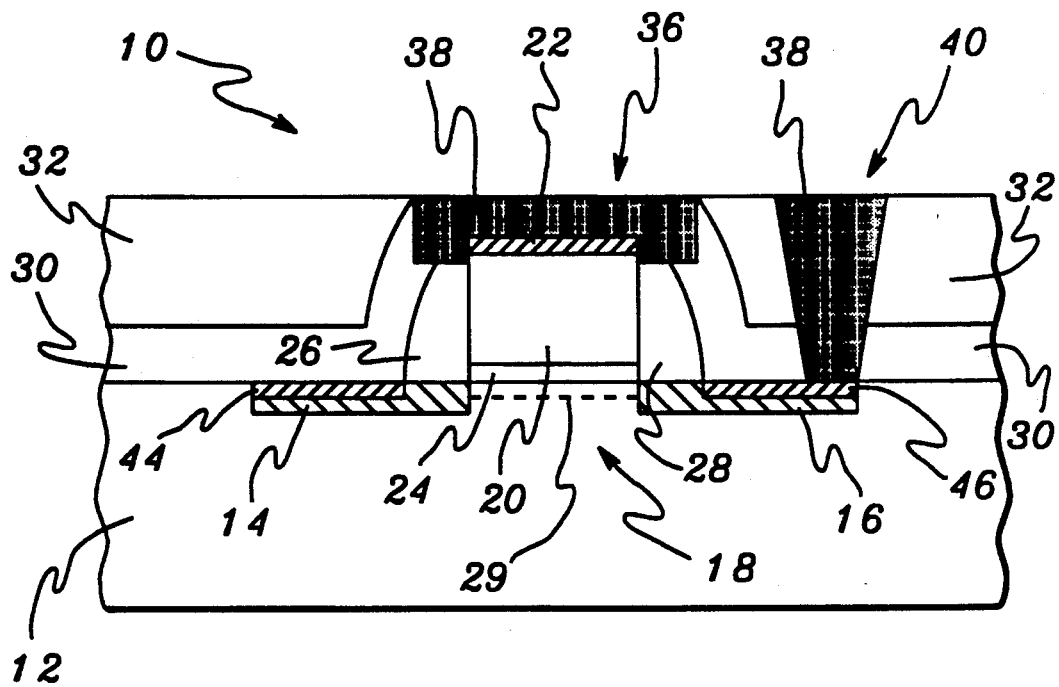
FIG. 4 depicts the integrated circuit device of FIG. 3 after the passivating layer is selectively removed above the gate, a trench is created above a junction, and the opening above the gate and the trench are each planarly filled with a low sheet resistance conductive material, creating low resistance contacts to the source and junction.

At this point in the inventive process, the portion of passivating layer 32 above gate stack 1 is removed as shown in FIG. 4. As an example, reactive ion etching may be used to open trench 36. In the context of the present invention, a trench is synonymous with a hole and denotes an opened area where once filled, a contact will be created. Using the example PSG passivating layer and nitride insulation, the etch rate of nitride compared to PSG is about 3-to-1, and the etch rate of nitride compared to polycrystalline silicon is about 5.5-to-1. In this way, passivating layer 30 is removed to form trench 36 selective to insulating layer 32 and gate stack 18. That is, passivating layer 30 is removed, while removing very little of insulating layer 32 or gate stack 18. It will be understood that although spacers 26 and 28 are shown partially removed in FIG. 4, they need not be. The example composition of spacers 26 and 28 is silicon nitride, which the etch chemistry for creating trench 36 in PSG passivating layer 30 is not selective to. Another composition may be chosen for the spacers, so that the etch chemistry would be selective to it.

A trench above one or both of the junctions is created, utilizing the passivating layer 30 as an etch stop. A trench 40 is created above a junction in the insulating layer selective to the passivating layer. Trench 40 is then extended through passivating layer 30, selective to junction 16. That is, the etching process used to extend trench 40 to expose junction 16 is chosen such that little or none of junction 16 is affected. As with trench 36, trench 40 could be formed using reactive ion etching and merely changing the chemistry used after exposing the passivating layer. It will be understood that trenches 36 and 40 could be etched simultaneously. Such techniques are well-known in the art and need not be further explained.

Trenches 36 and 40 may now be filled with a low sheet resistance conductive material 38, such as tungsten, creating contacts to the gate stack 18 and junction 16. As is known in the art, sheet resistance refers to resistance per area of thin materials. The material 38 should be made planar with the nowplanarized insulating layer 32 in contemplation of the next level processing. One way, for example, to planarly fill trenches 36 and 40 is to deposit a layer of low sheet resistance conductive material such that the trenches are filled, then planarize to remove the excess. Another way to planarly fill trenches 36 and 40 is to selectively deposit low sheet resistance conductive material within the trenches. To selectively deposit means to cause the material to "grow" only within the trenches, as is known in the art.

It will be understood that trenches 36 and 40 could each be filled with a different material having the low sheet resistance property. For example, one trench could be created and filled, and then the other created and filled with a different material. It will also be understood that trenches 36 and 40 could also have spacers within them and then be filled with a low sheet resistance conductive material to prevent unwanted contact with other structures within the integrated circuit device.

After trench 36 is opened, an option available is to enhance silicidation of region 22 in gate stack 18. It will be understood that this enhanced silicidation is self-aligned. If the polysilicon region 20 of gate stack 18 is n+ doped, enhanced silicidation may be advisable, since n+ doping does not lend well to silicidation. Thus, it is possible that the prior silicidation, which included the junctions, was insufficient with respect to the gate. Enhanced silicidation of the gate remedies this. In this way, silicidation of gate stack 18 is enhanced without further siliciding junctions 14 and 16 (i.e., the gate is decoupled from the junctions). After enhanced silicidation, e.g., using titanium, as in the present embodiment, a single anneal is required to achieve low sheet resistance on the polysilicon. It is possible to accomplish this anneal, which involves high temperatures, without agglomeration. See Lasky et al., "Comparison of Transformation to Low-Resistance Phase and Agglomeration of $TiSi_2$ & $CoSi_2$," 38 IEEE Transactions on Electron Devices 262 (February 1991). If, for example, tungsten was chosen as the low sheet resistance material, no anneal would be necessary.

However, some unsilicided polysilicon should remain in contact with dielectric layer 24 to prevent spiking through. Spiking is understood in the art. How much polysilicon should remain unsilicided depends on sheet resistance requirements versus device degradation due to spiking and dopant depletion. The lowest sheet resistance is obtained when maximum silicidation takes place. The proper amount of polysilicon to leave in a given gate stack after silicidation for a given application can be found through experimentation.

As an example, consider a gate stack initially comprising 2000 angstroms of undoped polysilicon. During silicidation of those portions of the diffusion region that will become the junctions, 360 angstroms of titanium are deposited on the gate stack. The titanium reacts with the polysilicon to form a maximum of 545 angstroms of $TiSi_2$. After creating the opening above the gate stack, 740 angstroms of Ti are deposited over the gate stack. After reacting with the polysilicon, a maximum of 1115 angstroms of additional $TiSi_2$ are formed on the gate stack, giving a total maximum $TiSi_2$ gate stack portion of 1660 angstroms. A minimum of 500 angstroms of polysilicon is left on the gate stack between the $TiSi_2$ and the dielectric layer after enhanced silicidation. It will be understood that if the polysilicon were doped, all maximum values given would be lower.

Figure 5:
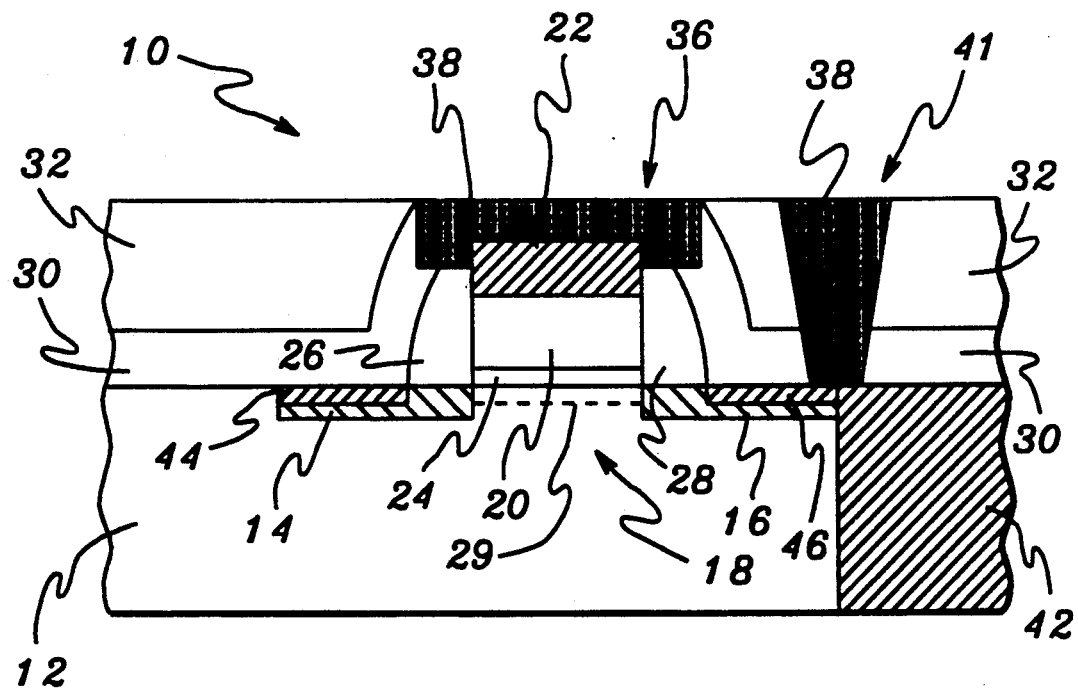
FIG. 5 depicts an integrated circuit device fabricated according to a second embodiment of the process of the present invention.

In a second embodiment of the invention, a low sheet resistance borderless contact is provided for contacting at least one of the junctions. FIG. 5 depicts the integrated circuit device 10 of FIG. 4 with an isolation region 42 provided in substrate 12 adjacent to junction 16, and trench 41 filled to create a borderless contact. Isolation regions separate devices on a wafer and may comprise, for example, silicon dioxide. To create such a borderless contact, a trench 41 is first created in insulating layer 32 above both junction 16 and isolation region 42 selective to passivating layer 30. The trench is then extended through passivating layer 30 selective to and partially exposing junction 16 and isolation region 42.

Trenches 36 and 41 may now be filled with a low sheet resistance conductive material 38 and planarized simultaneously. This could be accomplished by depositing a layer of material 38 over insulating layer 32 and trenches 36 and 41, then removing the unwanted portion. Another approach could be to use a selective deposition, that is one in which deposition is only on the silicon or silicide regions and not on the passivation or insulation layers. This creates low resistance contacts to junction 16 and gate stack 18. As in the first embodiment, the material filling trench 36 need not be the same as for trench 41. The characterization of the contact to junction 16 as "borderless" refers to the partial incursion into the area above isolation region 42. If the contact was only above junction 16, it would not be borderless. Making the contact borderless has a distinct advantage, in that circuit density is gained. Present design criteria set a minimum distance between gate stack 18 and the junction contact. A given size for the contact thus would require a larger junction 16 in order to be completely within the region above junction 16 and still be at the minimum distance from gate stack 18.

The present invention, as exemplified by the embodiments described herein, advances the state of the art by providing a process for improving sheet resistance of an integrated circuit device gate in a silicidation fabrication scheme. A dual-use passivation layer is introduced, acting as both a polish stop for planarization and an etch stop for creation of contacts. The process integrates easily into existing fabrication processes and can be selfaligned, requiring no additional masking level which reduces the cost of production. Further, enhanced silicidation of the gate is also facilitated without affecting shallow source and drain regions, and avoiding agglomeration. In a second embodiment, a contact to one or both junctions may be borderless to increase density.

While presently preferred embodiments of the invention have been described and depicted herein, alternative embodiments may be effected by those skilled in the art to accomplish the same objectives. Accordingly, it is intended by the appended claims to cover all such alternative embodiments as fall within the true spirit and scope of the invention.

We claim:

1. A process for improving sheet resistance of an integrated circuit device gate during fabrication on a silicon substrate, said integrated circuit device including an integrated circuit structure comprising at least two junctions, a spacer between said gate and each said junction, and a thin dielectric layer between said gate and said substrate, said junctions having been previously silicided, said process comprising:
   depositing a passivating layer on said integrated circuit structure;
   depositing an insulating layer on said passivating layer;
   planarizing said insulating layer;
   planarly removing said planarized insulating layer to expose said passivating layer above said gate;
   removing said passivating layer above said gate selective to said insulating layer and said gate to expose a top of said gate;

creating a trench in said insulating layer above at least one junction selective to said passivating layer;
extending said trench through said passivating layer selective to said at least one junction;
forming a first contact by planarly filling said exposed area above said gate with a first low sheet resistance conductive material; and
forming a second contact by planarly filling said extending trench above said at least one junction with a second low sheet resistance conductive material.

2. The process of claim 1, wherein said first and second low sheet resistance conductive materials are the same.

3. The process of claim 2, wherein said low sheet resistance conductive material comprises tungsten.

4. The process of claim 2, wherein said exposed area above said gate and said extended trench are planarly filled by:
depositing a layer of low sheet resistance conductive material over said insulating layer, said extended trench and said exposed area above said gate sufficient to fill said exposed area above said gate and said extended trench; and
planarizing said low sheet resistance conductive material layer down to said insulating layer.

5. The process of claim 2, wherein said exposed area above said gate and said extended trench are planarly filled by selectively depositing low sheet resistance conductive material within said exposed area above said gate and said extended trench, such that planarization is unnecessary.

6. The process of claim 1, wherein said gate includes a silicon material, said process further comprising silicidation of said gate after exposing the top of said gate.

7. The process of claim 3, wherein said silicidation step includes reacting titanium with said gate to form a silicide material.

8. The process of claim 6, wherein silicidation of said gate is accomplished by:
depositing a layer of reactive material over said insulating layer and said exposed area above said gate to react with said gate, forming a silicide; and
removing any unreacted portion of said reactive material.

9. The process of claim 1, wherein said gate comprises $p^+$ doped polycrystalline silicon.

10. The process of claim 1, wherein said gate comprises $n^+$ doped polycrystalline silicon.

11. The process of claim 1, wherein said gate comprises polycrystalline silicon.

12. The process of claim 1, wherein said planarization of said insulating layer is accomplished by chemical-mechanical polishing.

13. The process of claim 1, wherein step of planarizing said insulating layer is accomplished by reactive ion etching.

14. The process of claim 1, wherein said gate includes a silicon material and is partially silicided.

15. The process of claim 1, wherein said passivating layer comprises silicon nitride.

16. The process of claim 1, wherein said passivating layer removal above said gate is accomplished by anisotropic etching.

17. The process of claim 16, wherein said anisotropic etching comprises reactive ion etching.

18. The process of claim 1, wherein said step of removing said passivating layer above said gate is further selective to said spacers.

19. A process for improving sheet resistance of an integrated circuit device gate during fabrication on a silicon substrate, said integrated circuit device including an integrated circuit structure comprising at least two junctions, a spacer between said gate and each of said junctions, an isolation region in said substrate next to at least one of said junctions, and a thin dielectric layer between said gate and said substrate, said junctions having been previously silicided, said process comprising:
depositing a passivating layer on said integrated circuit structure;
depositing an insulating layer on said passivating layer;
planarizing said insulating layer;
planarly removing said planarized insulating layer to exposed said passivating layer above said gate;
removing said passivating layer above said gate selective to said insulating layer and said gate to expose a top of said gate;
forming a trench in said insulating layer above said at least one junction selective to said passivating layer, said trench being partially above at least one junction and partially above said isolation region;
extending said trench through said passivating layer selective to said at least one junction and said isolation region;
forming a contact by planarly filling said exposed area above said gate with a first low sheet resistance conductive material; and
forming a borderless contact by planarly filling said extended trench with a second low sheet resistance conductive material.

20. The process of claim 19, wherein said first and second low sheet resistance conductive materials are the same.

21. The process of claim 20, wherein said low sheet resistance conductive material comprises tungsten.

22. The process of claim 20, wherein said exposed area above said gate and said extended trench are planarly filled by:
depositing a layer of low sheet resistance conductive material over said insulating layer, said extended trench and said exposed area above said gate sufficient to fill said exposed area above said gate and said extended trench; and
planarizing said low sheet resistance conductive material layer down to said insulating layer.

23. The process of claim 20, wherein said exposed area above said gate and said extended trench are planarly filled by selectively depositing low sheet resistance conductive material within said exposed area above said gate and said extended trench, such that planarization is unnecessary.

24. The process of claim 20, wherein said low sheet resistance conductive material comprises tungsten.

25. The process of claim 19, wherein said gate includes a silicon material, said process further comprising silicidation of said gate after exposing the top of said gate.

26. The process of claim 25, wherein said silicidation step includes reacting titanium with said gate to form a silicide material.

27. The process of claim 25, wherein silicidation of said gate is accomplished by:
depositing a layer of reactive material over said insulating layer and said exposed area above said gate to react with said gate, forming a silicide; and removing any unreacting portion of said reactive material.

28. The process of claim 19, wherein said gate comprises p+ doped polycrystalline silicon.

29. The process of claim 19, wherein said gate comprises n+ doped polycrystalline silicon.

30. The process of claim 19, wherein said gate comprises polycrystalline silicon.

31. The process of claim 19, wherein said planarization of said insulating layer is accomplished by chemical-mechanical polishing.

32. The process of claim 19, wherein said step of planarizing said insulating layer is accomplished by reactive ion etching.

33. The process of claim 36, wherein said anisotropic etching comprises reactive ion etching.

34. The process of claim 19, wherein said gate includes a silicon material and is partially silicided.

35. The process of claim 19, wherein said passivating layer comprises silicon nitride.

36. The process of claim 19, wherein said passivating layer removal above said gate is accomplished by anisotropic etching.

37. The process of claim 19, wherein said step of removing said passivating layer above said gate is further selective to said spacers.

* * * * *

UNITED STATES PATENT AND TRADEMARK OFFICE
CERTIFICATE OF CORRECTION

PATENT NO. : 5,268,330
DATED : December 7, 1993
INVENTOR(S) : Givens et al.

It is certified that error appears in the above-indentified patent and that said Letters Patent is hereby corrected as shown below:

In the Claims:

Claim 1, col. 7, line 9, substitute --extended-- for "extending"

Claim 13, col. 7, line 54, insert --said-- between "wherein" and "step"

Claim 19, col. 8, line 17, substitute --expose-- for "exposed"

Claim 27, col. 9, line 1, substitute --unreacted-- for "unreacting"

Signed and Sealed this

Twenty-seventh Day of September, 1994

Attest:

BRUCE LEHMAN

Attesting Officer          Commissioner of Patents and Trademarks